(12) United States Patent
Lee et al.

(10) Patent No.: US 10,644,269 B2
(45) Date of Patent: May 5, 2020

(54) ORGANIC LIGHT-EMITTING DISPLAY DEVICE

(71) Applicant: LG Display Co., Ltd., Seoul (KR)

(72) Inventors: Jae-Sung Lee, Seoul (KR); Jong-Hyeok Im, Busan (KR); Do-Hyung Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/841,154

(22) Filed: Dec. 13, 2017

(65) Prior Publication Data

US 2018/0190944 A1    Jul. 5, 2018

(30) Foreign Application Priority Data

Dec. 30, 2016 (KR) .................. 10-2016-0184484

(51) Int. Cl.
*H01L 51/52* (2006.01)
*H01L 27/32* (2006.01)
(Continued)

(52) U.S. Cl.
CPC ...... *H01L 51/5284* (2013.01); *H01L 27/3246* (2013.01); *H01L 27/3248* (2013.01);
(Continued)

(58) Field of Classification Search
CPC .................. H01L 51/5284; H01L 27/3246
See application file for complete search history.

(56) References Cited

U.S. PATENT DOCUMENTS

| 2009/0026932 A1* | 1/2009 | Kwak ............... H01L 27/3272 |
| | | 313/504 |
| 2013/0056784 A1* | 3/2013 | Lee .................. H01L 27/3279 |
| | | 257/99 |

(Continued)

FOREIGN PATENT DOCUMENTS

| CN | 103066212 A | 4/2013 |
| CN | 103915478 A | 7/2014 |

(Continued)

*Primary Examiner* — Lex H Malsawma
*Assistant Examiner* — Xia L Cross
(74) *Attorney, Agent, or Firm* — Seed IP Law Group LLP (57) ABSTRACT

Disclosed is an organic light-emitting display device that is capable of preventing the reflection of light incident from outside and improving transparency when a transparent display is realized. The organic light-emitting display device includes a first substrate defined by a transmission area and a light emission area, a first electrode located on a region of a planarization film, which covers a thin film transistor, corresponding to the light emission area, the first electrode being electrically connected to the thin film transistor, and a shielding layer located to cover a region of the planarization film corresponding to the transmission area and the side surface of the planarization film, the shielding layer being electrically isolated from the first electrode. A black bank is provided between the transmission area and the emission area so as to cover the edge of the first electrode, and an organic light emissive layer and a second electrode, which covers the organic light emissive layer, are sequentially formed on the first electrode.

20 Claims, 8 Drawing Sheets

(51) Int. Cl.
 *H01L 51/56* (2006.01)
 *G02B 5/00* (2006.01)

(52) U.S. Cl.
 CPC ...... *H01L 27/3258* (2013.01); *H01L 27/3262* (2013.01); *H01L 27/3272* (2013.01); *H01L 27/3279* (2013.01); *H01L 51/5215* (2013.01); *H01L 51/5228* (2013.01); *H01L 51/56* (2013.01); *G02B 5/003* (2013.01); *H01L 2227/323* (2013.01)

(56) References Cited

U.S. PATENT DOCUMENTS

| | | | |
|---|---|---|---|
| 2014/0183502 A1* | 7/2014 | Song | H01L 27/3246 257/40 |
| 2014/0312323 A1* | 10/2014 | Park | H01L 51/525 257/40 |
| 2015/0194638 A1 | 7/2015 | Choi et al. | |
| 2016/0149155 A1* | 5/2016 | Kim | H01L 51/5228 |
| 2016/0190225 A1* | 6/2016 | Kim | H01L 27/3276 257/40 |
| 2016/0322453 A1 | 11/2016 | Park et al. | |

FOREIGN PATENT DOCUMENTS

| | | | |
|---|---|---|---|
| CN | 104124259 A | | 10/2014 |
| CN | 105742324 A | | 7/2016 |

\* cited by examiner

ORGANIC LIGHT-EMITTING DISPLAY DEVICE

This application claims the benefit of Korean Patent Application No. 10-2016-0184484, filed on Dec. 30, 2016, which is hereby incorporated by reference as if fully set forth herein.

BACKGROUND

Technical Field

The present disclosure relates to an organic light-emitting display device, and more particularly to an organic light-emitting display device that is capable of reducing the reflection of external light and improving transmittance when a transparent display is realized using the organic light-emitting display device.

Description of the Related Art

Image display devices, which are a core technology in the information and communication age and serve to display various kinds of information on a screen, have been developed such that the image display devices are thinner, lighter, and portable and exhibit high performance. In addition, organic light-emitting display devices, which control the amount of light that is emitted from an organic light-emitting layer to display an image, have been highlighted as flat panel display devices that have lower weight and volume than cathode ray tubes (CRT).

In an organic light-emitting display device, a plurality of pixels is arranged in the form of a matrix to display images. Each pixel includes a light-emitting element, and the organic light-emitting display device includes a pixel-driving circuit including a plurality of transistors configured to independently drive the respective light-emitting elements and storage capacitors. Each light-emitting element includes an emission layer disposed between a first electrode and a second electrode.

In recent years, research has been actively conducted into top-emission type organic light-emitting display devices that are capable of realizing a transparent display. In organic light-emitting display devices that realize such a transparent display, a polarizing plate for reducing the reflection of external light cannot be used. As a result, transparent top-emission type organic light-emitting display devices do not satisfactorily prevent the reflection of external light, which causes deterioration in the quality of images.

BRIEF SUMMARY

Accordingly, the present disclosure is directed to an organic light-emitting display device that substantially obviates one or more problems due to limitations and disadvantages of the related art.

An object of the present disclosure is to provide an organic light-emitting display device that is capable of preventing the reflection of light incident from outside and improving transparency when a transparent display is realized.

Additional advantages, objects, and features of the disclosure will be set forth in part in the description which follows and in part will become apparent to those having ordinary skill in the art upon examination of the following, or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, an organic light-emitting display device includes a first substrate defined by a transmission area and a light emission area, a first electrode located on a region of a planarization film, which covers a thin film transistor, corresponding to the light emission area, the first electrode being electrically connected to the thin film transistor, and a shielding layer located to cover a region of the planarization film corresponding to the transmission area and the side surface of the planarization film, the shielding layer being electrically isolated from the first electrode. A black bank is provided between the transmission area and the light emission area so as to cover the edge of the first electrode, and an organic light emissive layer and a second electrode, which covers the organic light emissive layer, are sequentially formed on the first electrode.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Reference will now be made in detail to the preferred embodiments of the present disclosure, examples of which are illustrated in the accompanying drawings. Wherever possible, the same reference numbers will be used throughout the drawings to refer to the same or like parts. In the following description of the present disclosure, a detailed description of known functions and configurations incorporated herein will be omitted when it may obscure the subject matter of the present disclosure. In addition, the terms used in the following description are selected in consideration of ease of preparation of the specification, and may be different from the names of parts constituting an actual product.

It will be understood that when an element is referred to as being "on," "above," "under" or "beside" another element, one or more intervening elements may be present therebetween, as long as the term "immediately" or "directly" is not used.

It may be understood that, although the terms "first," "second," etc., may be used herein to describe various elements, these elements are not to be limited by these terms. These terms are generally only used to distinguish one element from another. In the following description, therefore, an element identified by "first" may be an element identified by "second" without falling outside the technical concept of the present disclosure.

The size and thickness of each element shown in the drawings are given merely for the convenience of description, and the present disclosure is not limited thereto.

Hereinafter, various embodiments of the present disclosure will be described in detail with reference to the accompanying drawings.

Figure 1:
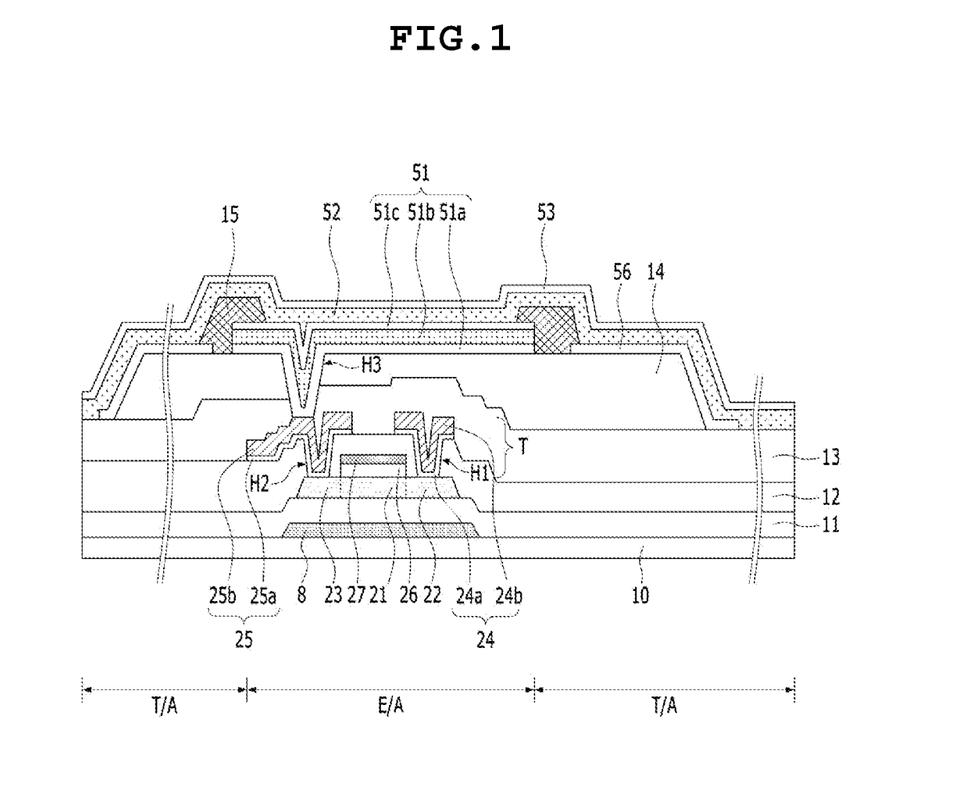
FIG. 1 is a schematic view illustrating an organic light-emitting display device according to a first embodiment of the present disclosure.

FIG. 1 is a schematic view illustrating an organic light-emitting display device according to a first embodiment of the present disclosure.

The organic light-emitting display device according to the first embodiment of the present disclosure includes a thin film transistor T located on a first substrate 10, which is defined by a light emission area E/A and a transmission area T/A, a passivation layer 13 provided on the thin film transistor T, a planarization film 14 provided on the passivation layer 13, a first electrode 51 located on a region of the planarization film 14 corresponding to the light emission area E/A, the first electrode 51 being electrically connected to the thin film transistor T, an organic light emissive layer 52 provided on the first electrode 51, and a second electrode 53 provided on the organic light emissive layer 52. A shielding layer 56 is provided on a region of the planarization film 14 corresponding to the transmission area T/A. A black bank 15 is further provided so as to correspond to a region between the transmission area T/A and the emission area E/A. The black bank 15 covers the edge of the first electrode 51.

A further detailed description will be given with reference to FIG. 1.

Referring to FIG. 1, a buffer layer 11 is located on the first substrate 10. The buffer layer 11 serves to prevent moisture or impurities from permeating through the first substrate 10 and to planarize the upper part of the first substrate 10. The buffer layer 11 may be made of an inorganic insulation material, such as SiNx or SiOx.

An active layer 21 made of a semiconductor, such as a silicon or oxide semiconductor, is formed on the buffer layer 11. A gate insulation film 26 is located on the active layer 21, and a gate electrode 27 is located on the gate insulation film 26. The gate electrode 27 is located so as to overlap a channel region of the active layer 21 via the gate insulation film 26. The gate electrode 27 may have a single-layer or multi-layer structure made of any one selected from among molybdenum (Mo), aluminum (Al), chrome (Cr), gold (Au), titanium (Ti), nickel (Ni), neodymium (Nd), and copper (Cu) or an alloy thereof.

A shading layer 8 is located under a region in which the thin film transistor T is located. The shading layer 8 may serve to block light incident on the active layer 21 and to reduce parasitic capacitance generated between the thin film transistor T and various wires (not shown). The shading layer 8 may be made of any one selected from among silver (Ag), nickel (Ni), gold (Au), platinum (Pt), aluminum (Al), copper (Cu), molybdenum (Mo), titanium (Ti), and neodymium (Nd) or an alloy thereof.

An interlayer insulation film 12 is located on the gate electrode 27. The interlayer insulation film 12 is located on the entirety of one surface of the first substrate 10 extending from an active area A/A so as to include a lower pad unit of a pad area. The interlayer insulation film 12 may be formed so as to have a single-layer or multi-layer structure made of an inorganic insulation material, such as SiNx or SiOx.

The interlayer insulation film 12 is provided with a first contact hole H1, through which a source region 22 of the active layer 21 is exposed, and a second contact hole H2, through which a drain region 23 is exposed.

A source electrode 24 is connected to the source region 22 through the first contact hole H1, and a drain electrode 25 is connected to the drain region 23 through the second contact hole H2. The source electrode 24 and the drain electrode 25 may have a single-layer or multi-layer structure made of any one selected from among molybdenum (Mo), aluminum (Al), chrome (Cr), gold (Au), titanium (Ti), nickel (Ni), neodymium (Nd), and copper (Cu) or an alloy thereof. As shown in FIG. 1, the source electrode 24 may have a two-layer structure including a first source division layer 24a and a second source division layer 24b, and the drain electrode 25 may have a two-layer structure including a first drain division layer 25a and a second drain division layer 25b.

The passivation layer 13 is located on the thin film transistor T. The passivation layer 13 may be formed so as to have a single-layer or multi-layer structure made of an inorganic film, such as SiNx or SiOx. The passivation layer 13 serves to protect the thin film transistor T. Depending on the design, the passivation layer 13 may be omitted.

The planarization film 14 is located on the passivation layer 13. The planarization film 14 serves to planarize the upper part of the first substrate 10 on which the thin film transistor T is located. The planarization film 14 may be made of, for example, acrylic resin, epoxy resin, phenolic resin, polyamide resin, or polyimide resin.

The first electrode 51 is formed on the planarization film 14. The first electrode 51 is provided on a position corresponding to the emission area E/A of the first substrate 10, and is electrically connected to the thin film transistor T. The first electrode 51 is electrically connected to a drain electrode 25 of the thin film transistor T through a third contact hole H3 formed by removing a portion of the planarization film 14 and the passivation layer 13 so as to expose the drain electrode 25.

The first electrode 51 may serve as an anode or a cathode. In FIG. 1, the first electrode 51 serves as an anode.

The first electrode 51 is made of a transparent conductive material having a relatively large work function value, such as ITO, IZO, ZnO, or IGZO. In addition, the first electrode 51 may be configured so as to include a metal material exhibiting high reflectance, such as aluminum (Al), silver (Ag), or APC (Ag/Pb/Cu). The reason for this is that, in order to improve the efficiency of top emission and lifespan of the light-emitting element, light incident on the lower side of the organic light-emitting element is reflected upward, thereby contributing to the emission of the light-emitting element. A metal material exhibiting high reflectance, such as aluminum (Al) or silver (Ag), has low resistance to oxidization due to external oxygen or moisture. For this reason, the first electrode 51 includes a first electrode lower-layer part 51a, a first electrode middle-layer part 51b, and a first electrode upper-layer part 51c. The middle-layer part 51b includes a material exhibiting high reflectance, such as silver (Ag), and the lower-layer part 51a and the upper-layer part 51c are made of a transparent conductive material in order to protect the metal layer of the middle-layer part 51b, which is highly reflective. The first electrode upper-layer part 51c is made of a transparent conductive material such that light reflected by the first electrode middle-layer part 51b is transmitted through the first electrode upper-layer part 51c and emitted to the upper side of the organic light-emitting element. In the organic light-emitting display device according to the present disclosure, therefore, light incident on the lower side of the organic light-emitting element is reflected upward to contribute to the emission of the organic light-emitting element, thereby improving the efficiency and lifespan of the organic light-emitting element.

The shielding layer 56 is provided on a position of the upper region of the planarization film 14 corresponding to the transmission area T/A. The shielding layer 56 may be made of a transparent conductive material that is separated from the first electrode 51 and is thus electrically isolated from the first electrode 51. The shielding layer 56 may be made of the same material as the first electrode lower-layer part 51a, and may be formed simultaneously with the first electrode lower-layer part 51a.

The shielding layer 56 is provided so as to cover a portion of the upper region of the planarization film 14 corresponding to the transmission area T/A, and serves to prevent outgassing through the planarization film 14. In addition, the shielding layer 56 extends to the side surface of the planarization film 14 to prevent the planarization film 14 from being exposed to the outside.

The black bank 15 is provided at a position of the upper region of the planarization film 14 corresponding to a region between the transmission area T/A and the emission area E/A. The black bank 15 is made of a material exhibiting a low dielectric constant. For example, the black bank 15 may be made of at least one selected from among black resin, graphite powder, gravure ink, black spray, and black enamel, all of which are organic insulation materials. The black bank 15 serves to define a pixel region of the organic light-emitting display device and to absorb light incident from outside, thereby preventing the reflection of the external light. In addition, the black bank 15 covers a region of the upper layer of the planarization film 14 where the shielding layer 56 is not provided to further prevent outgassing through the planarization film 14.

The organic light emissive layer 52 is provided on the first electrode 51. The organic light emissive layer 52 may be configured as a series of layers, some of which might not, as individual layers emit light, but the structure of layer 52 as a whole is a light emissive layer. For example, the layer 52 may have a structure including a hole injection layer (HIL)/a hole transport layer (HTL)/an light emissive layer (EML)/an electron transport layer (ETL)/an electron injection layer (EIL). In addition, the organic light emissive layer 52 may further include at least one functional layer for improving the light emission efficiency and lifespan of the emissive layer, such as a charge generation layer for generating charges, an additional electron transport layer, or an additional hole transport layer.

The organic light emissive layer 52 may extend so as to cover the upper part of the black bank 15 for mask reduction. The light emissive layer of the organic light emissive layer 52 may be provided only on the first electrode 51.

The second electrode 53 is provided so as to cover the organic light emissive layer 52 and the upper part of the black bank 15. In the case in which the first electrode 51 serves as an anode, the second electrode 53 serves as a cathode. In a top-emission type organic light-emitting display device, the second electrode 53 is made of a metal material having a sufficiently small thickness (e.g., about 200 Å or less) to transmit light and a small work function value such that light from the organic light emissive layer 52 is transmitted through the second electrode 53, thereby achieving top emission. The second electrode 53 may be made of at least one selected from among silver (Ag), titanium (Ti), aluminum (Al), molybdenum (Mo), and an alloy of silver (Ag) and magnesium (Mg). In addition, the second electrode 53 is made of a transparent conductive material, such as ITO, IZO, IGZO, or ZnO, such that light from the organic light emissive layer 52 is transmitted through the second electrode 53, thereby achieving top emission.

A second substrate (not shown) may be laminated to the second electrode 53 via an adhesive layer (not shown). Depending on the design, the adhesive layer and the second substrate may be omitted. The second substrate may be replaced by a thin film type encapsulation member.

The organic light-emitting display device according to the present disclosure is a transparent organic light-emitting display device including a transmission area T/A and a light emission area E/A wherein no additional polarizing plate is provided.

Since a transparent organic light-emitting display device of the related art does not include a polarizing plate, external light is reflected and is visible to a user when images are displayed. Consequently, the reflection of external light deteriorates the quality of the displayed images.

The main region from which the external light is reflected is a region around the light emission area E/A in which circuits are located. The external light is reflected by metal constituting the circuits.

In the organic light-emitting display device according to the present disclosure, the black bank 15 is provided between the transmission area T/A and the light emission area E/A. In the organic light-emitting display device according to the present disclosure, the black bank 15 is provided around the emission area E/A to absorb external light, thereby minimizing the reflection of the external light by the metal constituting the circuits. According to the present disclosure, therefore, the black bank 15 is provided around the emission area E/A, thereby minimizing the reflection of the external light. Since the black bank 15 is provided only around the emission area and the shielding layer is provided on the other regions, transmittance is improved while deterioration in quality of images due to the external light is minimized. Consequently, the organic light-emitting display device according to the present disclosure has the effect of realizing a transparent display having excellent image quality.

Figure 2:
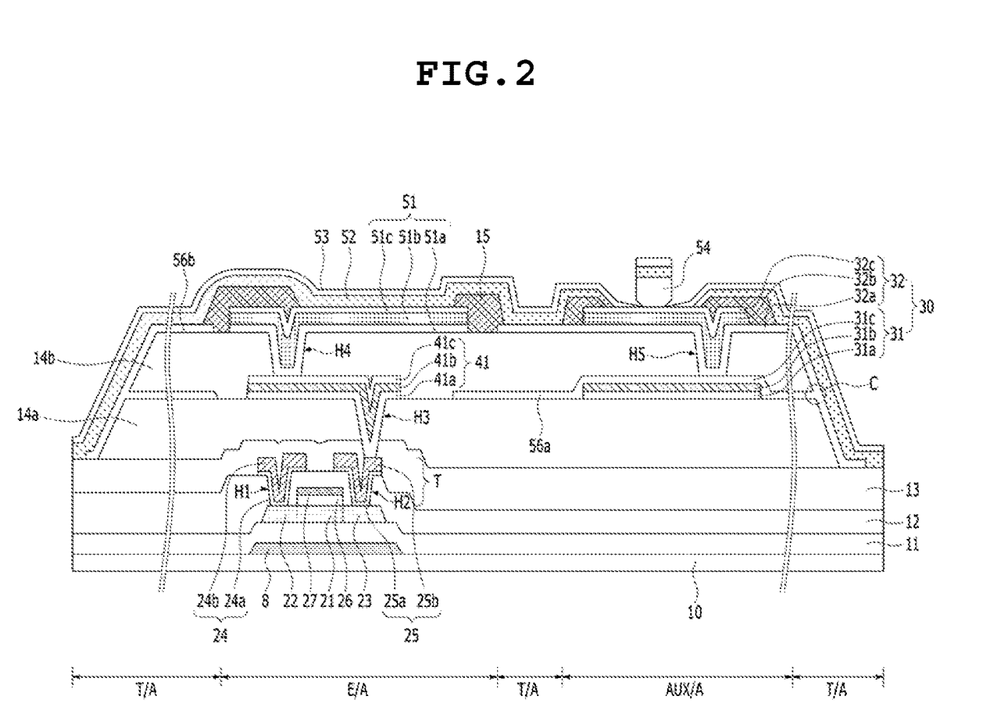
FIG. 2 is a schematic view illustrating an organic light-emitting display device including an auxiliary electrode and a connection electrode according to a second embodiment of the present disclosure.

FIG. 2 is a schematic view illustrating an organic light-emitting display device including an auxiliary electrode and a connection electrode according to a second embodiment of the present disclosure.

The organic light-emitting display device according to the second embodiment includes a thin film transistor T located on a first substrate 10, which is defined by an emission area E/A, a transmission area T/A, an auxiliary electrode area Aux/A, a passivation layer 13 provided on the thin film transistor T, a first planarization film 14a provided on the passivation layer 13, a connection electrode 41 located on the first planarization film 14a so as to contact the thin film transistor T, a second planarization film 14b for covering the connection electrode 41, a first electrode 51 located on a region of the second planarization film 14b corresponding to the emission area E/A, the first electrode 51 being electrically connected to the thin film transistor T, an organic light emissive layer 52 provided on the first electrode 51, and a second electrode 53 provided on the organic light emissive layer 52.

An auxiliary electrode 30 is provided on the auxiliary electrode area Aux/A. The auxiliary electrode 30 may include a first auxiliary electrode 31 located on the same layer as the connection electrode 41 and a second auxiliary electrode 32 located on the same layer as the first electrode 51. The second electrode 53 is made of a transparent conductive material for top emission or a sufficiently thin metal material to transmit light, whereby the second electrode 53 has high resistance. The auxiliary electrode 30 is connected to the second electrode 53 to reduce the resistance of the second electrode 53.

A first shielding layer 56a may be further provided on a region of the first planarization film 14a corresponding to the transmission area T/A. The first shielding layer 56a serves to prevent outgassing through the first planarization film 14a. The first shielding layer 56a is made of a transparent conductive material to transmit external light. The first shielding layer 56a extends to the side surface of the first planarization film 14a to cover the side surface of the first planarization film 14a.

A second shielding layer 56b is further provided on a region of the second planarization film 14b corresponding to the transmission area T/A. The second shielding layer 56b serves to prevent outgassing through the second planarization film 14b. The second shielding layer 56b is made of a transparent conductive material, like the first shielding layer 56a. The second shielding layer 56b extends to the side surface of the second planarization film 14b to cover the side surface of the second planarization film 14b.

A black bank 15 is further provided on a region of the second planarization film 14b corresponding to a region between the transmission area T/A and the emission area E/A. The black bank 15 covers the edge of the first electrode 51. The black bank 15 may be further provided on a region of the second planarization film 14b corresponding to a region between the auxiliary electrode area Aux/A and the transmission area T/A.

As previously described, the black bank 15 may be made of at least one selected from among black resin, graphite powder, gravure ink, black spray, and black enamel, all of which are organic insulation materials. The black bank 15 serves to define a pixel region of the organic light-emitting display device and to absorb light incident from outside, thereby preventing the reflection of the external light. In addition, the black bank 15 covers a region of the upper layer of the second planarization film 14b where the second shielding layer 56b is not provided to further prevent outgassing through the second planarization film 14b.

A further detailed description will be given with reference to FIG. 2.

Referring to FIG. 2, the thin film transistor T is provided on the first substrate 10. A shading layer 8 is located between the thin film transistor T and the first substrate 10.

The thin film transistor T and the shading layer 8 are the same as those described in the first embodiment, and therefore a detailed description thereof will be omitted. Like the first embodiment, the passivation layer 13 is provided on the thin film transistor T.

The first planarization film 14a is provided on the passivation layer 13. The first planarization film 14a has the same characteristics as the planarization film 14 of the first embodiment. The first planarization film 14a is provided with a third contact hole H3 formed by removing a portion of the first planarization film 14a and the passivation layer 13 so as to expose a drain electrode 25.

The connection electrode 41 is provided on a position of the first planarization film 14a corresponding to the emission area E/A.

In the organic light-emitting display device according to the second embodiment of the present disclosure, the second planarization film 14b is further provided due to the further provision of the first auxiliary electrode 31. As a result, the connection electrode 41 is further provided to connect the first electrode 51 and the drain electrode 25 on the first planarization film 14a. The connection electrode 41 may be formed to have a three-layer structure including a lower-layer part 41a, a middle-layer part 41b, and an upper-layer part 41c.

The middle-layer part 41b of the connection electrode 41 may be made of a material exhibiting high conductivity, such as aluminum (Al), chrome (Cr), or copper (Cu). The above materials exhibit high electrical conductivity, but have low resistance to external oxygen or moisture. For this reason, the lower-layer part 41a and the upper-layer part 41c of the connection electrode 41 may be made of a material exhibiting high corrosion resistance to protect the middle-layer part 41b of the connection electrode 41.

Typically, the lower-layer part 41a of the connection electrode 41 is made of MoTi. The lower-layer part 41a of the connection electrode 41 may also be made of a transparent conductive material. In addition, the lower-layer part 41a of the connection electrode 41 may be made of various other materials. The upper-layer part 41c of the connection electrode 41 is made of a transparent conductive material, such as ITO, IZO, IGZO, or ZnO, to protect the middle-layer part 41b of the connection electrode 41.

The second planarization film 14b is provided on the connection electrode 41. The second planarization film 14b covers the irregularities formed by the connection electrode 41 and the auxiliary electrode 30, whereby the upper surface of the second planarization film 14b is planarized. The second planarization film 14b may be made of the same material as the first planarization film 14a.

The first electrode 51 is located on a region of the second planarization film 14b corresponding to the light emission area E/A. The organic light emissive layer 52 is provided on the first electrode 51, and the second electrode 53 is provided on the organic light emissive layer 52.

Like the first embodiment, the first electrode 51 includes a lower-layer part 51a, a middle-layer part 51b, and an upper-layer part 51c. The middle-layer part 51b of the first electrode 51 includes a material exhibiting high reflectance, such as silver (Ag), and the lower-layer part 51a and the upper-layer part 51c of the first electrode 51 are made of a transparent conductive material in order to protect the metal layer of the middle-layer part 51b of the first electrode 51, which is highly reflective. The first electrode 51 is electrically connected to the connection electrode 41 via a fourth contact hole H4 provided on the second planarization film 14b.

The organic light emissive layer 52 and the second electrode 53 are the same as those described in the first embodiment, and therefore a detailed description thereof will be omitted.

A portion of the transmission area T/A of the first substrate 10 is defined as the auxiliary electrode area Aux/A. The auxiliary electrode 30 is provided on the auxiliary electrode area Aux/A. As previously described, the auxiliary electrode 30 includes the first and second auxiliary electrodes 31 and 32.

The first auxiliary electrode 31 is formed on the same layer as the connection electrode 41. The first auxiliary electrode 31 may have a three-layer structure including a first layer 31a, a second layer 31b, and a third layer 31c.

The second layer 31b of the first auxiliary electrode 31 may be made of a material exhibiting high conductivity, such as aluminum (Al), chrome (Cr), or copper (Cu), like the middle-layer part 41b of the connection electrode 41. In addition, like the connection electrode 41, the first layer 31a and the third layer 31c of the first auxiliary electrode 31 may be made of a material exhibiting high corrosion resistance to protect the second layer 31b of the first auxiliary electrode 31.

Typically, the first layer 31a of the first auxiliary electrode 31 is made of MoTi. The first 31a of the first auxiliary electrode 31 may also be made of a transparent conductive material. In addition, the first layer 31a of the first auxiliary electrode 31 may be made of various other materials. The third layer 31c of the first auxiliary electrode 31 is made of a transparent conductive material, such as ITO, IZO, IGZO, or ZnO, to protect the second layer 31b of the first auxiliary electrode 31.

The second auxiliary electrode 32 is formed on the same layer as the first electrode 51. That is, the second auxiliary electrode 32 is located on the second planarization film 14b. The second auxiliary electrode 32 is electrically connected to the first auxiliary electrode 31 via a fifth contact hole H5 provided on the second planarization film 14b for allowing the third layer 31c of the first auxiliary electrode 31 to be exposed therethrough.

The second auxiliary electrode 32 may have a three-layer structure including a fourth layer 32a, a fifth layer 32b, and a sixth layer 32c.

Like the middle-layer part 51b of the first electrode 51, the fifth layer 32b of the second auxiliary electrode 32 includes a material exhibiting high reflectance, such as silver (Ag), and the fourth layer 32a and the sixth layer 32c of the second auxiliary electrode 32 are made of a transparent conductive material, such as ITO, IZO, IGZO, or ZnO, to protect the highly reflective material of the fifth layer 32b of the second auxiliary electrode 32. In other words, the second auxiliary electrode 32 may be made of the same material as the first electrode 51.

A partition wall 54 made of an organic insulation material and having a reverse taper shape may be further provided on the second auxiliary electrode 32. Since opposite side surfaces of the partition wall 54 have a reverse taper shape, a portion of the organic light emissive layer 52 may be discontinuous at the upper side of the partition wall 54. However, the organic light emissive layer 52 is not formed around the partition wall 54. As a result, the sixth auxiliary electrode division layer 32c of the second auxiliary electrode 32 is exposed around the partition wall 54, whereby the second electrode 53 and the second auxiliary electrode 32 contact each other around the partition wall 54.

The first shielding layer 56a is provided on a region of the first planarization film 14a corresponding to the transmission area T/A. In addition, the second shielding layer 56b is provided on a region of the second planarization film 14b corresponding to the transmission area T/A. As previously described, the first shielding layer 56a covers the upper part of the first planarization film 14a to prevent outgassing through the first planarization film 14a such that the organic light emissive layer 52 of the emission area E/A is not affected, and the second shielding layer 56b covers the upper part of the second planarization film 14b to prevent outgassing through the second planarization film 14b such that the organic light emissive layer 52 is not affected.

The first and second shielding layers 56a and 56b may be made of the previously described transparent conductive material. In this case, the third layer 31c of the first auxiliary electrode 31 may be made of a transparent conductive material to protect the second layer 31b of the first auxiliary electrode 31. The first shielding layer 56a may be integrally formed with the third layer 31c of the first auxiliary electrode 31. In other words, the first shielding layer 56a and the third layer 31c of the first auxiliary electrode 31 may be integrally formed so as to be electrically connected to each other.

The fifth division layer 32b of the second auxiliary electrode 32 is made of a metal material exhibiting high reflectance, and the fourth and sixth layers 32a and 32c of the second auxiliary electrode 32 are made of a transparent conductive material to protect the metal material. The second shielding layer 56b may be integrally formed with the fourth layer 32a of the second auxiliary electrode 32. In other words, the fourth layer 32a of the second auxiliary electrode 32 and the second shielding layer 56b may be integrally formed so as to be electrically connected to each other.

The first shielding layer 56a is connected to the third division layer 31c of the first auxiliary electrode 31, and the second shielding layer 56b is connected to the sixth layer 32c of the second auxiliary electrode 32. In addition, the first shielding layer 56a and the second shielding layer 56b are electrically isolated from the first electrode 51 and the connection electrode 41. That is, the first shielding layer 56a and the second shielding layer 56b may be connected to the auxiliary electrode 30 so as to perform some of the roles of the auxiliary electrode 30. Consequently, the organic light-emitting display device according to the present disclosure has substantially the same effect as increasing the area of the auxiliary electrode 30, thereby compensating for the low resistance of the second electrode 53.

Meanwhile, the first shielding layer 56a and the second shielding layer 56b may be connected to each other at the side surface C of the boundary line between the first planarization film 14a and the second planarization film 14b. As a result, the first shielding layer 56a and the second shielding layer 56b may substantially serve as the auxiliary electrode.

In the organic light-emitting display device according to the second embodiment of the present disclosure, the black bank 15 is provided on a region of the second planarization film 14b corresponding to a region between the transmission area T/A and the emission area E/A, like the first embodiment. The black bank 15 is made of the same material as in the first embodiment to cover a region on the second planarization film 14b where the shielding layer 56 is not provided, thereby further preventing outgassing through the second planarization film 14b.

In addition, the black bank 15 may be further provided on a region of the second planarization film 14b corresponding to a region between the auxiliary electrode area Aux/A and the transmission area T/A. The second auxiliary electrode 32 in the auxiliary electrode area Aux/A also includes a metal exhibiting high reflectance. Consequently, a region on which the auxiliary electrode 30 is formed is one of the sections where there is a high possibility of external light being reflected. The black bank 15 covers the edge of the second auxiliary electrode 32 to prevent upward outgassing through the second planarization film 14b and to reduce the reflection of external light due to the second auxiliary electrode 32.

As previously described, a second substrate (not shown) may be laminated to the second electrode 53 via an adhesive layer (not shown). Depending on the design, the adhesive layer and the second substrate may be omitted. The second substrate may be replaced by a thin film type encapsulation member.

Hereinafter, a method of manufacturing the organic light-emitting display device according to the present disclosure will be described with reference to the drawings. The method of manufacturing the organic light-emitting display device according to the first embodiment of the present disclosure and the method of manufacturing the organic light-emitting display device according to the second embodiment of the present disclosure are generally similar to each other. Consequently, the method of manufacturing the organic light-emitting display device according to the second embodiment of the present disclosure will be described, and the method of manufacturing the organic light-emitting display device according to the first embodiment of the present disclosure will be omitted.

FIGS. 3A to 3G are views illustrating the method of manufacturing the organic light-emitting display device according to the second embodiment of the present disclosure.

Figure 3A:
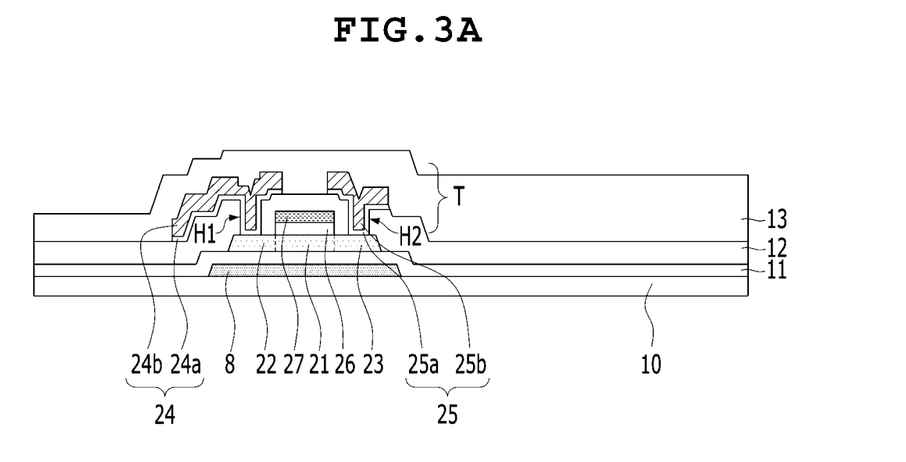
FIGS. 3A to 3G are views illustrating a method of manufacturing the organic light-emitting display device according to the second embodiment of the present disclosure.

First, as shown in FIG. 3A, a shading layer 8 is formed on a first substrate 10, and then a buffer layer 11 is formed on the entirety of one surface of the first substrate 10 by deposition so as to cover the upper part of the shading layer 8. The shading layer 8 may be formed by depositing and patterning any one selected from among silver (Ag), nickel (Ni), gold (Au), platinum (Pt), aluminum (Al), copper (Cu), molybdenum (Mo), titanium (Ti), and neodymium (Nd) or an alloy thereof. The buffer layer 11 is formed by depositing an inorganic insulation material.

Figure 3B:
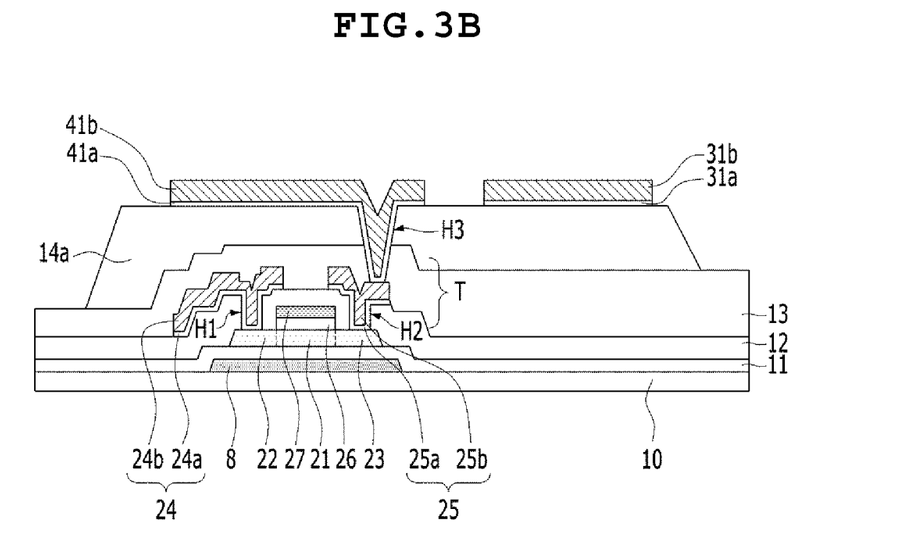

Subsequently, as shown in FIG. 3B, an active layer 21 made of a semiconductor material is formed on the buffer layer 11. A gate insulation film 26 and a gate electrode 27 are sequentially formed on a channel region of the active layer 21.

The gate electrode 27 may be formed by depositing and patterning a second metal layer (not shown) having a single-layer or multi-layer structure made of any one selected from among molybdenum (Mo), aluminum (Al), chrome (Cr), gold (Au), titanium (Ti), nickel (Ni), neodymium (Nd), and copper (Cu) or an alloy thereof. However, the disclosure is not limited thereto.

Subsequently, the active layer 21 is doped with a dopant using the gate electrode 27 as a mask to form a source region 22 and a drain region 23. In the case in which the active layer 21 is made of an oxide semiconductor, opposite sides of the active layer 21 may be made conductive through plasma processing to form source and drain regions 22 and 23.

Subsequently, an interlayer insulation film 12 is formed on the entire surface of the first substrate 10, including the gate electrode 27 and a lower pad unit. The interlayer insulation film 12 may be made of an inorganic insulation material, like the buffer layer 11.

Subsequently, the interlayer insulation film 12 is patterned to form a first contact hole H1, through which the source region 22 is exposed, and a second contact hole H2, through which the drain region 23 is exposed.

Subsequently, a source electrode 24 is formed on the interlayer insulation film 12 so as to be connected to the source region 22 through the first contact hole H1, and a drain electrode 25 is formed so as to be connected to the drain region 23 through the second contact hole H2. As previously described, the source electrode 24 and the drain electrode 25 may be formed so as to have a multi-layer structure. For example, when the source and drain electrodes 24 and 25 have a two-layer structure of MoTi/Cu, two-layer metals of MoTi/Cu may be stacked and simultaneously patterned on the entire upper surface of the interlayer insulation film 12 to simultaneously form the source and drain electrodes 24 and 25.

Figure 3C:
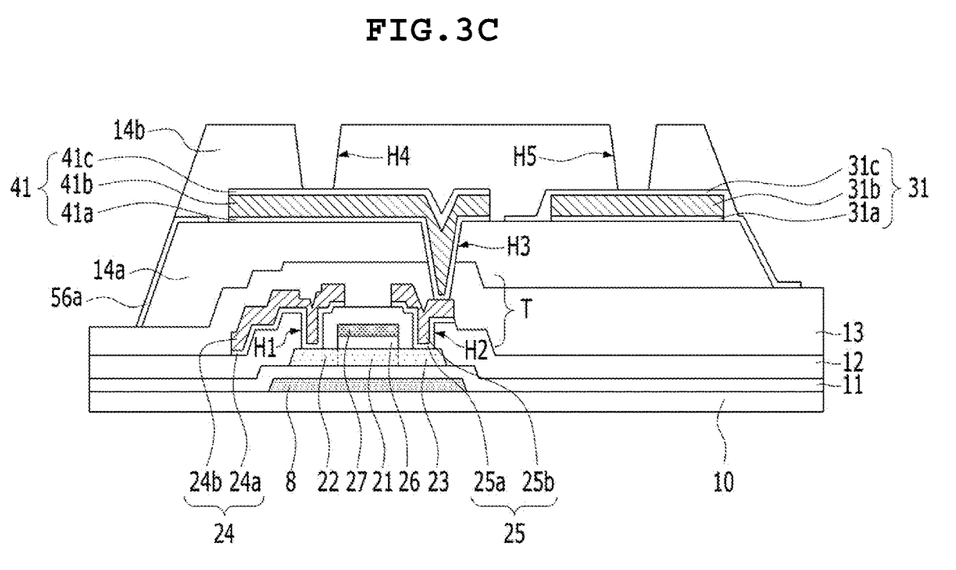

Subsequently, as shown in FIG. 3C, a first planarization film 14a is formed on a thin film transistor T. The first planarization film 14a may be made of acrylic resin, epoxy resin, phenolic resin, polyamide resin, or polyimide resin. A third contact hole H3 for allowing a connection electrode 41 to be connected to the drain electrode 25 therethrough is formed on the first planarization film 14a.

First and second metal layers 401 and 402, from which a connection electrode 41 and a first auxiliary electrode 31 will be formed, are deposited and patterned on the first planarization film 14a to form a lower-layer part 41a and a middle-layer part 41b of the connection electrode 41, and a first layer 31a and a second layer 31b of the first auxiliary electrode 31.

Figure 3D:
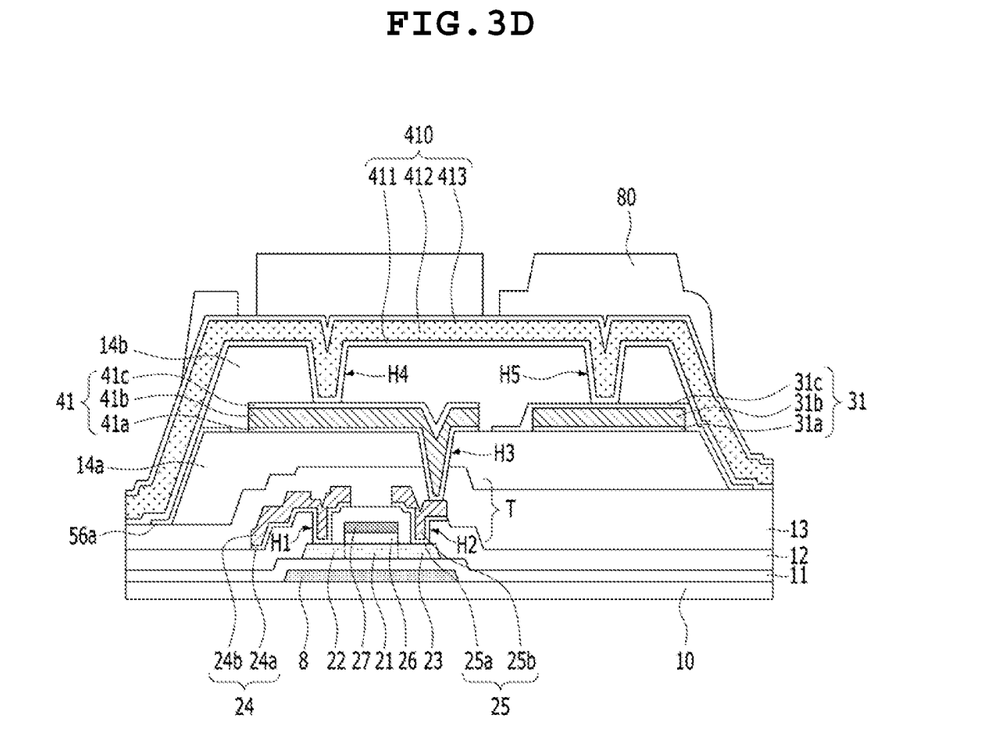

Subsequently, as shown in FIG. 3D, a transparent conductive material, such as ITO, is formed so as to cover the middle-layer part 41b of the connection electrode 41 and the second layer 31b of the first auxiliary electrode 31, and is patterned to form a upper-layer part 41c of the connection electrode 41, a first shielding layer 56a, and a third layer 31c of the first auxiliary electrode 31.

Subsequently, a second planarization film 14b is formed so as to cover the connection electrode 41 and the first auxiliary electrode 31. The second planarization film 14b is provided with a fourth contact hole H4, through which the connection electrode 41 is exposed, and a fifth contact hole H5, through which a second auxiliary electrode 32 is exposed.

Figure 3E:
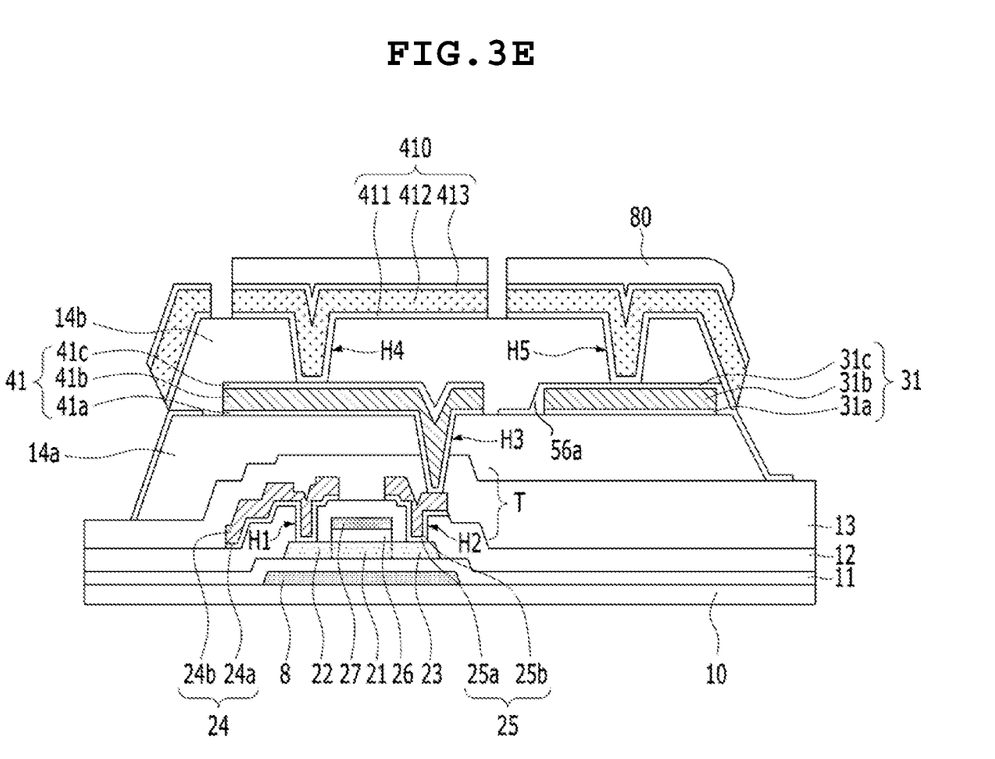

Subsequently, as shown in FIG. 3E, a metal layer 410, from which a first electrode 51 and a second auxiliary electrode 32 will be formed, is formed on the second planarization film 14b so as to cover the fourth contact hole H4 and the fifth contact hole H5. The metal layer 410 may be formed so as to have a three-layer structure including a third metal layer 411, a fourth metal layer 412, and a fifth metal layer 413. For example, the metal layer 410 may be formed so as to have a three-layer structure of ITO/Ag/ITO.

Subsequently, a photoresist 80 is applied to the upper part of the metal layer 410, and is patterned using a half-tone mask to partially remove the portion of the photoresist 80 where a second shielding layer 56b will be located, to completely remove the portion of the photoresist 80 where a black bank 15 will be located, and to leave the portion of the photoresist 80 corresponding to an emission area E/A in a thick state.

Figure 3F:
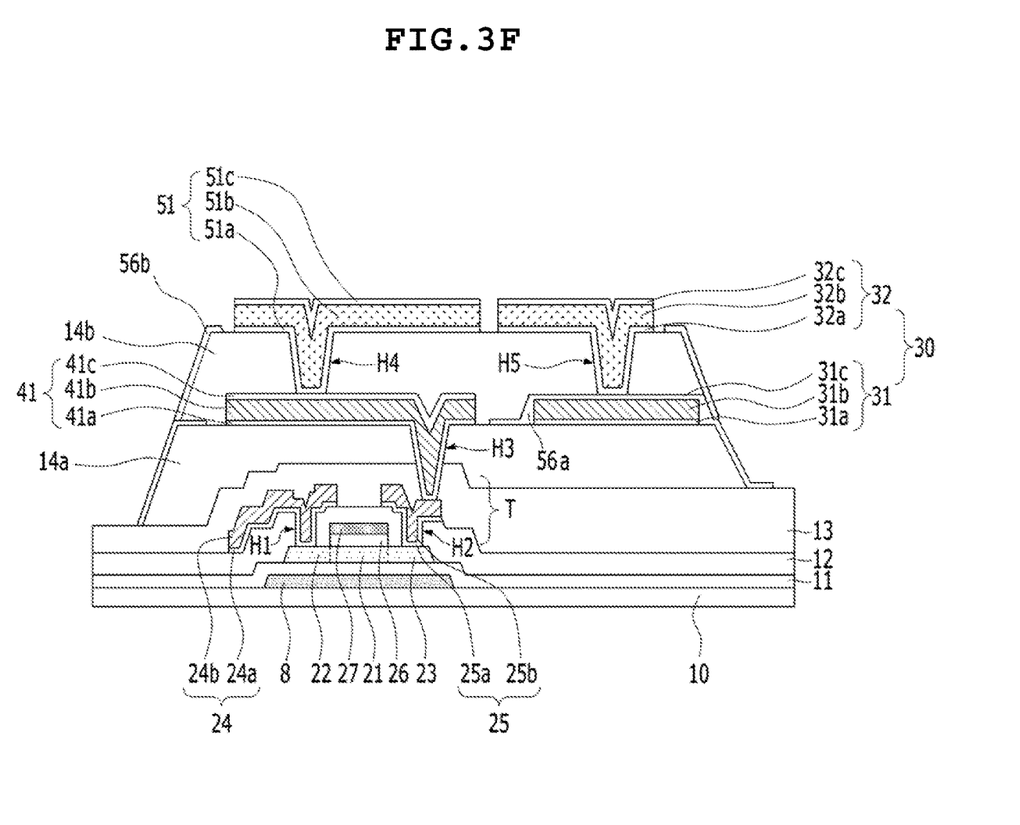

Subsequently, as shown in FIG. 3F, etching is performed to remove the portion of the metal layer 410 where a black bank 15 will be located. Subsequently, ashing is performed to remove the portion of the photoresist 80 where a second shielding layer 56b will be located and to leave the portion of the photoresist 80 corresponding to an emission area E/A.

Subsequently, etching is performed again to form a first electrode 51, a second shielding layer 56b, and a second auxiliary electrode 32. Subsequently, a black bank 15 is formed so as to cover the edge of the first electrode 51 and the edge of the second auxiliary electrode 32, and a partition wall 54 is formed on the second auxiliary electrode 32.

Figure 3G:
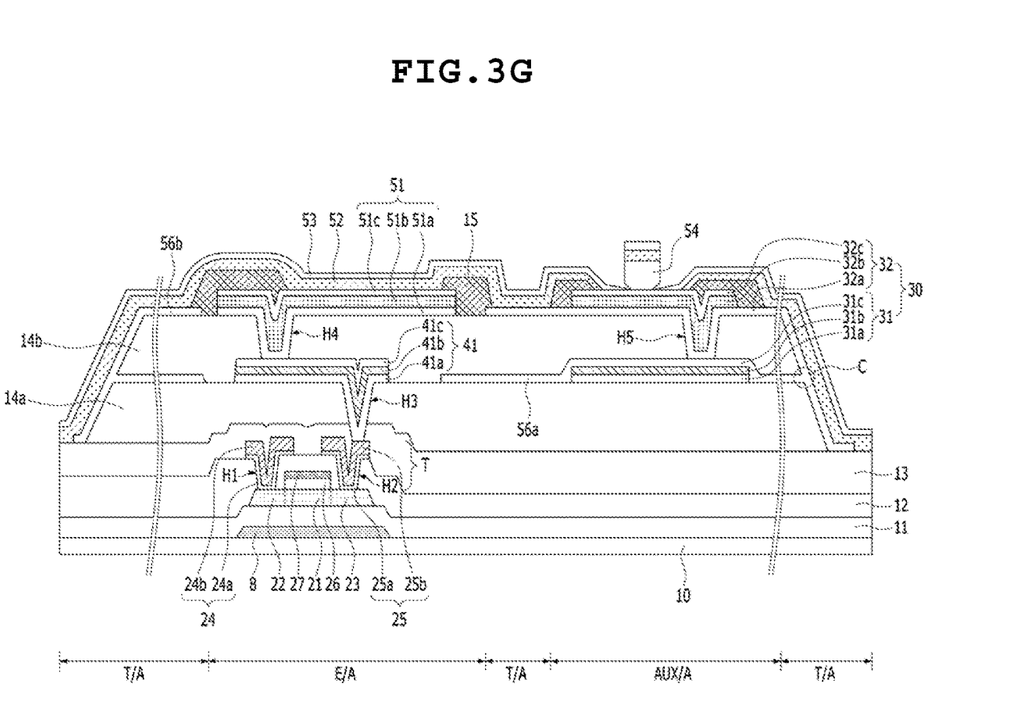

Subsequently, as shown in FIG. 3G, an organic light emissive layer 52 and a second electrode 53 are deposited on the first electrode 51. At this time, the organic light emissive layer 52 and the second electrode 53 may also be formed on the black bank 15 and the partition wall 54. The organic light emissive layer 52 is not formed around the partition wall 54, but the second electrode 53 is formed around the partition wall 54 such that the second electrode 53 and the second auxiliary electrode 32 are connected to each other around the partition wall 54.

As is apparent from the above description, in the organic light-emitting display device according to the present disclosure, the black bank is provided between the transmission area and the emission area. In the organic light-emitting display device according to the present disclosure, the black bank is provided around the emission area to absorb external light, thereby minimizing the reflection of the external light by metal constituting the circuits. Additionally, in the organic light-emitting display device according to the present disclosure, outgassing through the planarization film is prevented using the shielding layer in the transmission area, and the shielding layer is made of a transparent conductive material to transmit external light. According to the present disclosure, therefore, the black bank is provided around the emission area, thereby minimizing the reflection of the external light. Since the black bank is provided only around the emission area and the shielding layer is provided on the other regions, transmittance is improved while deterioration in the quality of images due to external light is minimized. Consequently, the organic light-emitting display device according to the present disclosure has the effect of realizing a transparent display having excellent image quality.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light-emitting display device comprising:
a first substrate having a transmission area and a light emission area;
a thin film transistor provided on the first substrate;
a passivation layer covering the thin film transistor;
a planarization film on the passivation layer;
a first electrode located on a region of the planarization film corresponding to the light emission area, the first electrode being electrically connected to the thin film transistor;
a shielding layer located to cover a region of the planarization film corresponding to the transmission area and a side surface of the planarization film, the shielding layer being electrically isolated from the first electrode;
a black bank located between the transmission area and the light emission area for covering an edge of the first electrode;
an organic light emissive layer located on the first electrode, extending on the side surface of the planarization film and overlapping the shielding layer; and
a second electrode located to cover the organic light emissive layer,
wherein the shielding layer on the side surface of the planarization film extends to on the passivation layer to contact the passivation layer in the transmission area and the organic light emissive layer contacts the shielding layer on the side surface of the planarization film, and on a contact portion of the shielding layer and the passivation layer in the transmission.

2. The organic light-emitting display device according to claim 1, wherein the shielding layer is made of a transparent conductive material.

3. The organic light-emitting display device according to claim 2, wherein the first electrode comprises:
a lower-layer part made of a transparent conductive material;
a middle-layer part comprising at least one selected from among aluminum (Al), silver (Ag), and APC (Ag/Pb/ Cu); and
an upper-layer part made of the transparent conductive material.

4. The organic light-emitting display device according to claim 3, wherein the shielding layer is made of a same material as the first electrode lower-layer part and is formed in a same layer as the first electrode lower-layer part.

5. The organic light-emitting display device according to claim 1, wherein the shielding layer is transparent and prevents contact between the planarization film and the organic light emissive layer in the transmission area.

6. An organic light-emitting display device comprising:
a first substrate having a transmission area that includes an auxiliary electrode area and a light emission area;
a thin film transistor provided on the first substrate;
a passivation layer covering the thin film transistor;
a first planarization film on the thin film transistor;
a connection electrode located on a region of the first planarization film corresponding to the light emission area, the connection electrode being electrically connected to the thin film transistor;
a first shielding layer located on a region of the first planarization film corresponding to the transmission area, the first shielding layer being electrically isolated from the connection electrode, the first shielding layer extending to a side surface of the first planarization film so as to cover the side surface of the first planarization film and contact the passivation layer;
a second planarization film located to cover the connection electrode and the first shielding layer;
a first electrode located on a region of the second planarization film corresponding to the light emission area, the first electrode being electrically connected to the connection electrode;
a second shielding layer located on a region of the second planarization film corresponding to the transmission area, the second shielding layer being electrically isolated from the first electrode, the second shielding layer extending to a side surface of the second planarization film in an area spaced away from the auxiliary electrode area so as to cover the side surface of the second planarization film and contact the first shielding layer;

a black bank located to cover an edge of the first electrode;

an organic light emissive layer located on the first electrode and extending on the side surfaces of the first and second planarization films, the organic light emissive layer being on the first and second shielding layer; and a second electrode located on the organic light emissive layer.

7. The organic light-emitting display device according to claim 6, wherein the organic light-emitting display device further comprises:

a first auxiliary electrode provided on a portion of a region of the first planarization film corresponding to the auxiliary electrode area; and a second auxiliary electrode located on the second planarization film so as to overlap the first auxiliary electrode, the second auxiliary electrode being electrically connected to the first auxiliary electrode.

8. The organic light-emitting display device according to claim 7, further comprising a black bank located to cover an edge of the second auxiliary electrode.

9. The organic light-emitting display device according to claim 7, wherein the first auxiliary electrode has a three-layer structure comprising a first layer, a second layer, and a third layer, the third auxiliary layer being made of a transparent conductive material, the third layer being integrally formed with the first shielding layer.

10. The organic light-emitting display device according to claim 7, wherein the second auxiliary electrode has a three-layer structure comprising a fourth layer, a fifth layer, and a sixth layer, the fourth and sixth layers being made of a transparent conductive material, the fourth layer being integrally formed with the second shielding layer.

11. The organic light-emitting display device according to claim 6, wherein the first shielding layer and the second shielding layer contact each other at the side surface of the first planarization film.

12. An organic light-emitting display device having a transmission area, an emission area, and an auxiliary electrode area comprising:

a thin film transistor on a substrate in the emission area;

a passivation layer located to cover the thin film transistor;

a first planarization film on the passivation layer;

a connection electrode on the first planarization film in the emission area, the connection electrode being electrically connected to the thin film transistor;

a first auxiliary electrode on the first planarization film in the auxiliary electrode area adjacent to the emission area and the transmission area;

a first shielding layer on the first planarization film in the transmission area and on the first auxiliary electrode in the auxiliary electrode area, the transmission area being between the emission area and the auxiliary electrode area, the first shielding layer being electrically isolated from the connection electrode, the first shielding layer covering at least one of side surfaces of the first planarization film;

a second planarization film on the connection electrode and the first shielding layer;

a first electrode on the second planarization film in the emission area, the first electrode being electrically connected to the connection electrode;

a second shielding layer on the second planarization film in the transmission area, the second shielding layer being electrically isolated from the first electrode, the second shielding layer covering at least one of side surfaces of the second planarization film;

an organic light emissive layer on the first electrode, extending on the at least one of side surfaces of the first planarization film and the at least one of side surfaces of the second planarization film, and overlapping the first and second shielding layers; and a second electrode located on the organic light emissive layer.

13. The organic light-emitting display device according to claim 12, the first shielding layer covering the at least one of side surfaces of the first planarization film being extended to contact the passivation layer.

14. The organic light-emitting display device according to claim 12, the second shielding layer covering the at least one of side surfaces of the second planarization film being extended to contact the first shielding layer.

15. The organic light-emitting display device according to claim 12, further comprising:

a second auxiliary electrode on the second planarization film in the auxiliary electrode area;

a black bank on the second planarization film located between the emission area and the transmission area, and located between the auxiliary electrode area and the transmission area, wherein the organic light emissive layer covers the black bank and the second shielding layer and the first shielding layer.

16. The organic light-emitting display device according to claim 15, wherein the second auxiliary electrode being electrically isolated from the first electrode.

17. The organic light-emitting display device according to claim 16, wherein the second auxiliary electrode being connected to the first shielding layer and the second shielding layer.

18. The organic light-emitting display device according to claim 17, wherein the second auxiliary electrode being connected to the first auxiliary electrode via the second shielding layer.

19. The organic light-emitting display device according to claim 12, wherein the black bank overlaps edges of the first electrode and edges of the second auxiliary electrode.

20. The organic light-emitting display device according to claim 12, wherein the first and second shielding layers are transparent and prevents contact between the first and second planarization films and the organic light emissive layer in the transmission area.

* * * * *